(12) United States Patent
Hiraku

(10) Patent No.: US 7,683,690 B2
(45) Date of Patent: Mar. 23, 2010

(54) MULTIPHASE CLOCK GENERATION CIRCUIT

(75) Inventor: Yasuyuki Hiraku, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 11/976,855

(22) Filed: Oct. 29, 2007

(65) Prior Publication Data

US 2008/0100364 A1 May 1, 2008

(30) Foreign Application Priority Data

Oct. 30, 2006 (JP) .............................. 2006-294756

(51) Int. Cl.
*H03K 3/00* (2006.01)
(52) U.S. Cl. ....................... 327/291; 327/156
(58) Field of Classification Search ................. 327/165, 327/166, 291, 147, 149, 152, 156, 158; 375/130; 713/600

See application file for complete search history.

(56) References Cited

U.S. PATENT DOCUMENTS 6,404,834 B1 * 6/2002 Hardin et al. ............... 375/376
7,434,083 B1 * 10/2008 Wilson ....................... 713/600
7,602,226 B1 * 10/2009 Hwang et al. ............... 327/291
2004/0257124 A1 12/2004 Araki et al.
2006/0001467 A1 1/2006 Fujino et al.

FOREIGN PATENT DOCUMENTS

JP 2005-20083 1/2005
JP 2006-20109 1/2006

* cited by examiner

*Primary Examiner*—Lincoln Donovan
*Assistant Examiner*—Colleen O'Toole
(74) *Attorney, Agent, or Firm*—McGinn IP Law Group, PLLC

(57) ABSTRACT

Provided is a multiphase clock generation circuit (1) including: a phase-locked loop circuit (10) for generating multiphase clock signals based on a reference clock signal; a frequency profile holding circuit (20) for holding a frequency profile of each of the multiphase clock signals, starting output of the frequency profile in response to a start signal, and for updating the frequency profile with a predetermined cycle based on the reference clock signal; and a clock selection circuit (30) for selecting a clock signal with an arbitrary phase from among the multiphase clock signals based on the frequency profile, and for feeding back the selected clock signal to the phase-locked loop circuit (10).

8 Claims, 14 Drawing Sheets

MULTIPHASE CLOCK GENERATION CIRCUIT

BACKGROUND OF THE INVENTION

1. Field of the Invention

The present invention relates to a multiphase clock generation circuit, and more particularly, to a multiphase clock generation circuit capable of changing a frequency of a multiphase clock signal to be generated.

2. Description of the Related Art

In recent years, a clock generation circuit is used in various semiconductor devices so as to generate clock signals. Examples of the clock generation circuit include a multiphase clock generation circuit capable of generating a plurality of clock signals with different phases (hereinafter, referred to as "multiphase clock signals"). The multiphase clock generation circuit is used as, for example, a clock generation circuit for a pulse width modulation circuit. The pulse width modulation circuit is a circuit for controlling a pulse width of a pulse width modulation (PWM) pulse which is generated in response to the multiphase clock signals.

The pulse width modulation circuit is used for, for example, a laser beam printer (LBP). The laser beam printer is widely used because of its high-resolution, silent, and high-speed features. In such apparatus, tone (i.e., density) is controlled based on an H width of a pulse for each dot to be printed.

Here, FIG. 12 shows a simple block diagram of the laser beam printer, and description is given of the laser beam printer. The laser beam printer controls a laser beam output from a laser beam 103 by using PWM pulse signals output from a pulse width modulation circuit 104. Then, the laser beam printer applies the laser beam onto a printing material (for example, paper) 101 through a lens 102 to thereby perform printing. Note that the printing is performed for each line by scanning the printing material with the laser beam in one direction.

FIG. 13 shows an example of printing results. As shown in FIG. 13, the printing is performed for each dot d and the tone of each dot is adjusted based on a width of a printing area p provided in each dot. In the laser beam printer, the position and width of the printing area p are controlled with the H width of the PWM pulse signal. Accordingly, in order to obtain an image with high definition, it is necessary for the pulse width modulation circuit 104 to control the pulse width with high precision. In order to achieve such performance, the pulse width modulation circuit 104 controls, with high precision, the pulse width of the PWM pulse signal to be output using the multiphase clock signals.

JP 2006-20109 A and US 2006/0001467, which are assigned to the same assignee as the present invention, each disclose an example of the pulse width modulation circuit 104. FIG. 14 shows a block diagram of the pulse width modulation circuit 104. The pulse width modulation circuit 104 generates multiphase clock signals with 256 phases based on a reference clock signal. Then, a synchronous position detection circuit 120 detects which multiphase clock signal is synchronized with a horizontal synchronous signal to be used as a reference for starting a scan, and outputs a synchronous position detection signal. A digital pulse data signal processing circuit 130 converts input digital pulse data into rise information or fall information of the PWM pulse based on synchronous position detection results so as to synchronize the horizontal synchronous signal with the PWM pulse. A multiphase clock selection circuit 140 selects a specified clock signal from among the signals contained in the multiphase clock signals based on the rise information and the fall information. A pulse width modulation signal generation circuit 150 generates a pulse width modulation signal (PWM pulse) based on the selected clock signal.

Specifically, the pulse width modulation circuit 104 enables control of the pulse width of the PWM pulse signal with high precision by using the multiphase clock signals. However, in the laser beam printer incorporating a plurality of drums, the frequency of the multiphase clock signal has to be finely adjusted in some cases so as to correct variation in characteristics of the drums. In this case, it is inefficient to change the frequency of the reference clock signal for each pulse width modulation circuit, so the frequency of the multiphase clock signal to be output from the multiphase clock generating circuit 110 is changed. In view of the above, JP 2005-20083 A and US 2004/257124 each disclose a technology of changing the frequency of the clock signal to be generated, by using the multiphase clock signals.

FIG. 15 shows a block diagram of a clock generating circuit 202 disclosed in US 2004/257124, and description is given of the clock generating circuit 202. The clock generating circuit 202 inputs an output clock signal CLKO to a delay-locked loop (DLL) 208 and generates multiphase clock signals with 10 phases. Further, in response to a control signal output from a control circuit 203, any one of the multiphase clock signals is selected by a selector 209. Then, the selected clock signal (selected clock signal CLKS) is fed back.

With the above-mentioned configuration, the clock generating circuit 202 controls the frequency of the output clock signal CLKO to be set high in a case where the fed-back selected clock signal CLKS has a phase which is delayed from that of the output clock signal CLKO (or a reference clock signal CLKR). Specifically, the clock generating circuit 202 selects a clock signal to be fed back from among the multiphase clock signals, to thereby control the frequency of the output clock signal CLKO.

However, in the laser beam printer, not only the variation in characteristics of the drums but also variation in characteristics of a lens 102 is caused. The variation in characteristics of the lens 102 is caused during a process of producing the lens, and variation in strain characteristic is caused depending on positions in the lens. When the variation in the characteristic of the lens 102 is caused, there arises a problem in that, for example, a width and a position of a printing area p do not correspond to the pulse width of the PWM pulse, depending on a dot position.

In the prior art, the multiphase clock signals are generated using the delay-locked loop 208. Then, by using the generated multiphase clock signals, the frequency of the multiphase clock signal output from the multiphase clock generating circuit 110 can be changed.

However, as the results of study, the inventor(s) of the present invention has(have) found it difficult to control the frequency with enough precision to correct the variation in characteristic of the lens 102, at phase intervals between the multiphase clock signals generated using the delay-locked loop 208. Further, if the frequency of the multiphase clock signal is changed in response to the control signal sent from an external portion as in the control circuit 203, it is difficult to give a desired change characteristic (hereinafter, referred to as "frequency profile") to the frequency of the multiphase clock signal according to the characteristics of the lens 102.

SUMMARY OF THE INVENTION

The present invention seeks to solve one or more of the above problems, or to improve upon those problems at least in part.

According to an aspect of the present invention, there is provided a multiphase clock generation circuit including: a phase-locked loop circuit for generating multiphase clock signals based on a reference clock signal; a frequency profile holding circuit for holding a frequency profile of each of the multiphase clock signals, starting output of the frequency profile in response to a start signal, and for updating the frequency profile with a predetermined cycle based on the reference clock signal; and a clock selection circuit for selecting a clock signal with an arbitrary phase from among the multiphase clock signals based on the frequency profile, and for feeding back the selected clock signal to the phase-locked loop circuit.

In the multiphase clock generating circuit according to the present invention, the clock signal to be fed back can be selected based on the frequency profile. In addition, the frequency profile can be updated with a predetermined cycle. As a result, the frequency profile of the multiphase clock signal can be arbitrarily set according to a desired output timing of the multiphase clock signal. Further, the phase of the clock signal to be fed back can be changed in smaller steps based on the frequency profile. Accordingly, the frequency of each of the multiphase clock signal can be controlled with high precision.

On the other hand, a pulse width adjustment circuit using the multiphase clock generation circuit according to the present invention operates in response to the multiphase clock signals controlled based on the frequency profile. Accordingly, a pulse width of a PWM pulse can be arbitrarily controlled according to a time (or timing).

In the multiphase clock generation circuit according to the present invention, the frequency of the multiphase clock signal to be output can be controlled based on an arbitrary frequency profile, and in addition, the frequency can be controlled with high precision.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
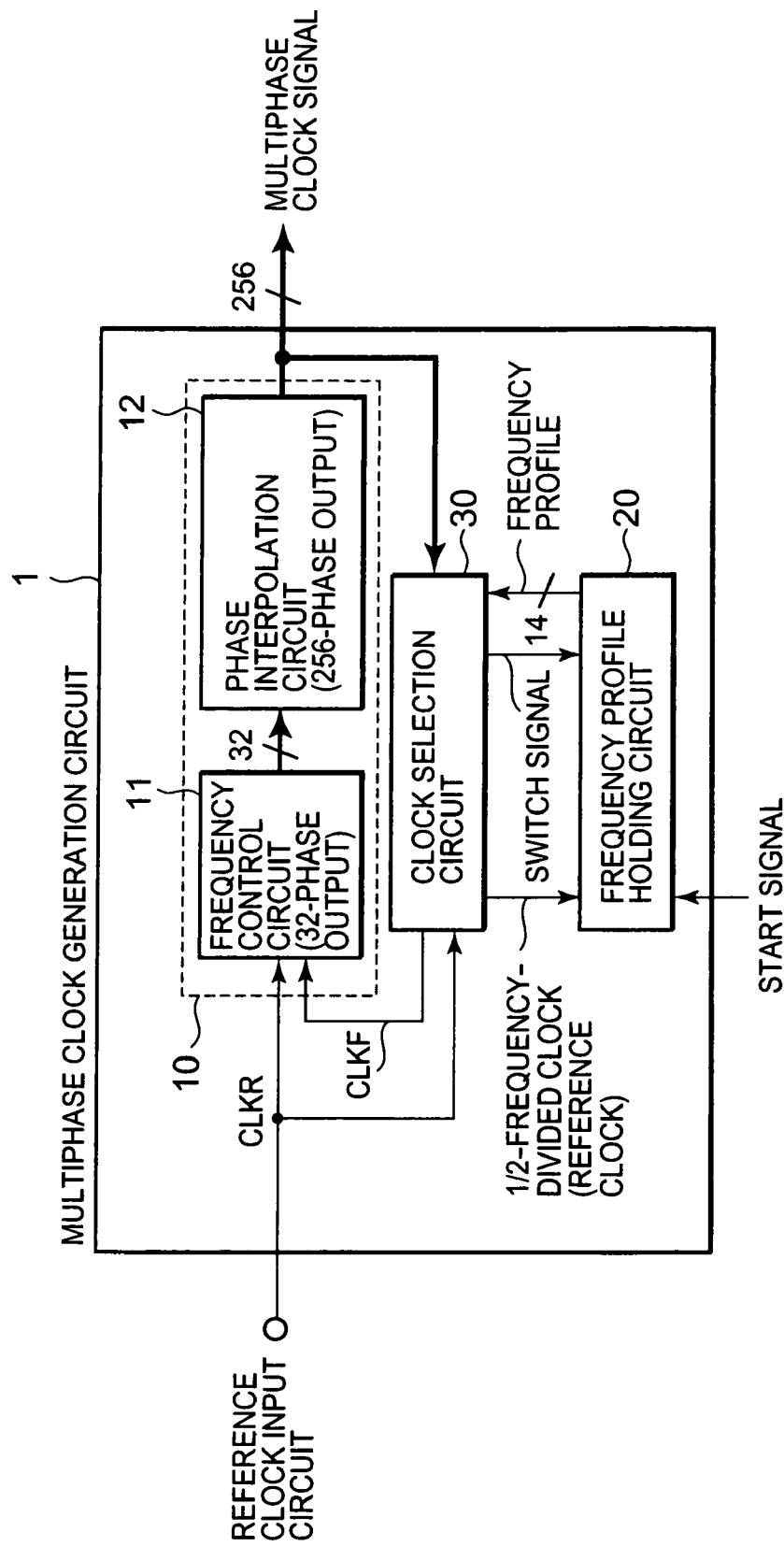
FIG. 1 is a block diagram of a multiphase clock generation circuit according to an embodiment of the present invention.

FIG. 1 shows a block diagram of a multiphase clock generation circuit 1 according to an embodiment of the present invention. As shown in FIG. 1, the multiphase clock generation circuit 1 according to the embodiment includes a phase-locked loop circuit (hereinafter, referred to as "PLL circuit") 10, a frequency profile holding circuit 20, and a clock selection circuit 30.

Figure 15:
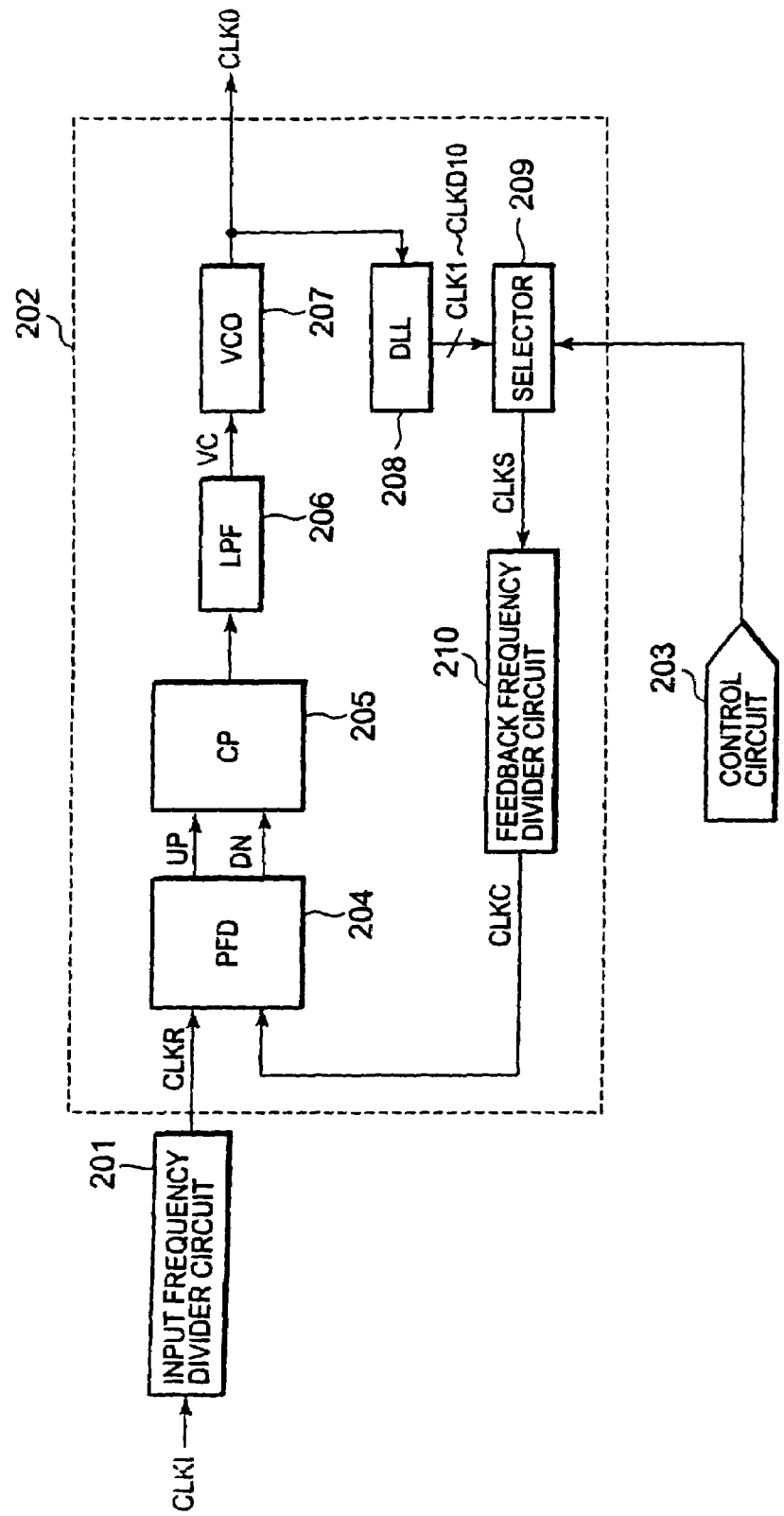
FIG. 15 is a diagram showing an example of a PLL circuit capable of changing a multiplication factor based on a multiphase clock according to the prior art.

The PLL circuit 10 includes a frequency control circuit 11 and a phase interpolation circuit 12. The frequency control circuit 11 controls a frequency of a clock signal to be output, based on a phase difference between a reference clock signal CLKR input from a reference clock signal input terminal and a feedback clock signal CLKF output from the clock selection circuit 30. Further, the frequency control circuit 11 outputs 32 clock signals which have the same frequency and have different phases. The frequency control circuit 11 can be realized by using, for example, a ring oscillator in which 16 stages of differential amplifiers are connected in series and an output of a final stage is inverted to be fed back to an initial stage. The frequency control circuit 11 includes, phase comparator comparing CLKF with CLKR, charge pump circuit, and LPF for control the frequency of the ring oscillator as well as the clock generation circuit 202 of FIG. 15.

The phase interpolation circuit 12 outputs 256 clock signals which have different phases (hereinafter, the clock signals are referred to as "multiphase clock signals") based on the clock signals output from the frequency control circuit 11. In this case, the phase interpolation circuit 12 generates the clock signals to be interpolated between the phases of the clock signals output from the frequency control circuit 11, and uses the clock signals to generate the 256 clock signals.

The frequency profile holding circuit 20 holds frequency profiles of the multiphase clock signals. In addition, the frequency profile holding circuit 20 starts output of the held frequency profiles in response to a start signal. Further, the frequency profile holding circuit 20 according to the embodiment updates the frequency profile to be output with a predetermined cycle based on a ½-frequency-divided clock signal which is obtained by dividing the frequency of the reference clock signal into two.

The clock selection circuit 30 selects the clock signal with an arbitrary phase from among the multiphase clock signals output from the PLL circuit 10, based on the frequency profile output from the frequency profile holding circuit 20, and feeds back the selected clock signal to the PLL circuit 10. In the embodiment, the feedback clock signal CLKF is generated as the signal to be fed back based on the selected clock signal, and the feedback clock signal CLKF is fed back to the PLL circuit 10. Further, the feedback clock signal CLKF is a signal from which an effect of hazard, which is caused when the selected clock signal is switched, is eliminated.

Figure 2:
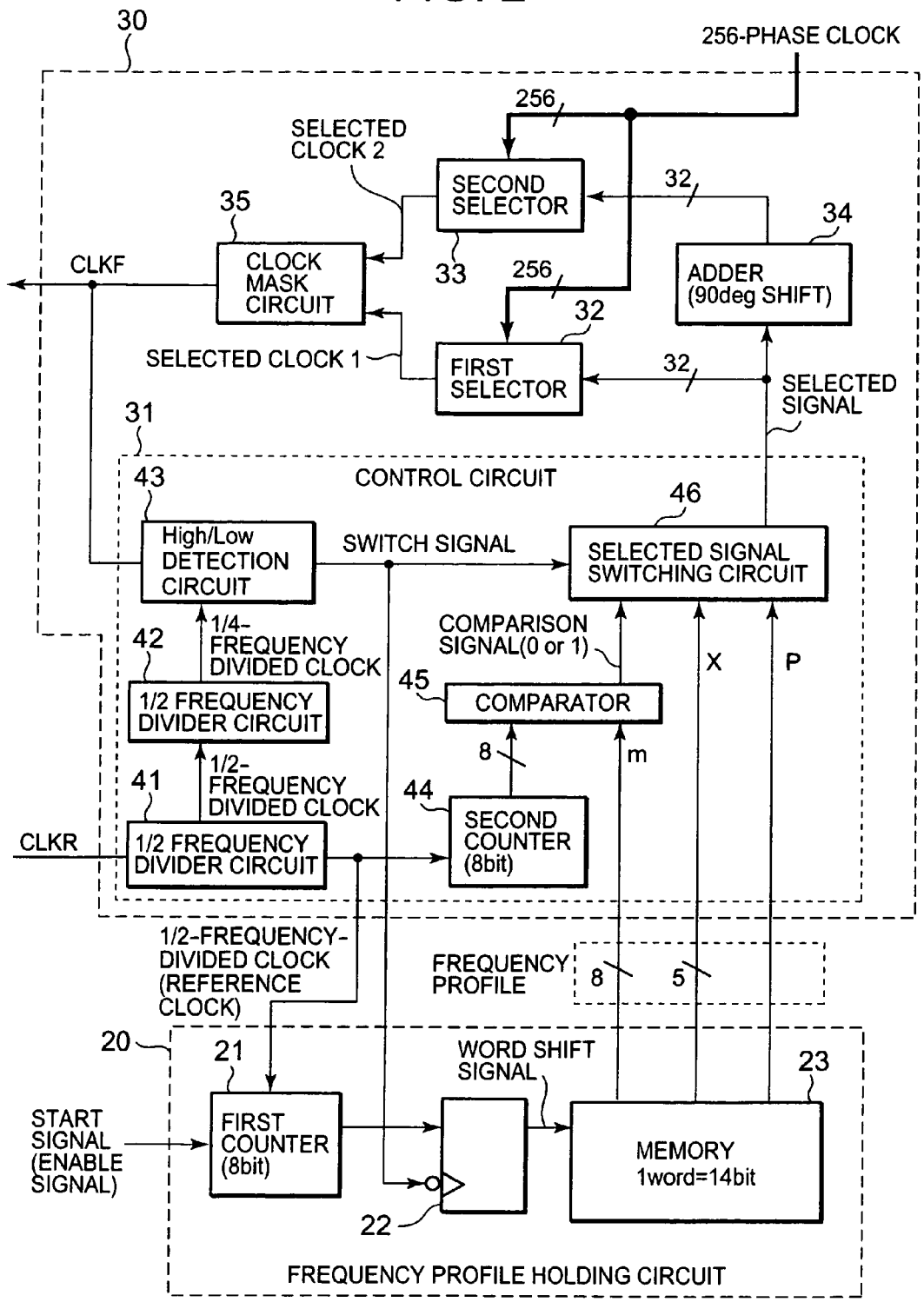
FIG. 2 is a detailed block diagram of a frequency profile holding circuit and a clock selection circuit according to the embodiment of the present invention.

Here, more detailed description is given of the frequency profile holding circuit 20 and the clock selection circuit 30. FIG. 2 shows a detailed block diagram of the frequency profile holding circuit 20 and the clock selection circuit 30. As shown in FIG. 2, the frequency profile holding circuit 20 includes a first counter 21, a D flip-flop 22, and a memory 23. The first counter 21 counts the number of clocks of the clock signal to be input, and outputs a high-level signal when a count value reaches a maximum value. In the embodiment, the ½-frequency-divided clock signal, which is obtained by dividing the frequency of the reference clock signal into two, is input as the clock signal whose clocks are counted by the first counter 21. The ½-frequency-divided clock signal is a clock signal obtained by dividing the frequency of the reference clock signal CLKR into two by a control circuit 31 to be described later. Further, the first counter 21 starts operations thereof in response to the start signal (enable signal) input externally from the frequency profile holding circuit 20.

The D flip-flop 22 holds a signal level of an output signal of the first counter 21 based on a falling edge of a switch signal to be generated in the control circuit 31. An output of the D flip-flop 22 is output as a word shift signal to the memory 23. The memory 23 includes a plurality of words and holds the frequency profiles in units of the words, for example. Then, the memory 23 allows the words to be output to be shifted in response to the word shift signal. In the embodiment, the words each hold 14-bit data and the memory 23 includes 128 words. In addition, the frequency profiles contain a fine adjustment period set value m, a change width set value X, and a polarity value P.

The fine adjustment period set value m is a value for setting a ratio for dividing a predetermined period in which the first counter 21 counts 8-bit of clocks. The fine adjustment period set value m according to the embodiment is a value of 8 bits which correspond to the number of bits of the clock to be counted by the first counter 21. The change width set value X is a value for setting a change width in a case where the phase selected by the clock selection circuit 30 is changed. For example, when the change width set value X is "8", the clock selection circuit 30 shifts the phase of the selected clock signal by 8 phases. The polarity value P is a value indicating a polarity in a case where the phase of the clock signal selected based on the change width set value is shifted. For example, when the polarity value P is "1", the clock selection circuit 30 shifts the phase of the clock signal to be selected by X phases in an adding direction. On the other hand, when the polarity value P is "0", the clock selection circuit 30 shifts the phase of the clock signal to be selected by X phases in a subtracting direction.

Further, as shown in FIG. 2, the clock selection circuit 30 includes the control circuit 31, a first selector 32, a second selector 33, an adder 34, and a clock mask circuit 35. The control circuit 31 performs settings so as to select a clock signal with a phase from among the multiphase clock signals based on the frequency profile output from the frequency profile holding circuit 20, and outputs the selected signal indicating the phase of the clock signal to be selected. The first selector 32 selects and outputs a clock signal with a specified phase from among the multiphase clock signals in response to a selected signal (the clock signal output from the first selector 32 is hereinafter referred to as "selected clock 1").

The adder 34 adds a predetermined value to the selected signal and shifts, for example, the phase designated by the selected signal by 90°. Further, the adder 34 delays the selected signal to be transmitted to the second selector 33. Then, the second selector 33 selects and outputs a specified clock signal from among the multiphase clock signals based on the selected signal whose phase is shifted by the adder 34 (the clock signal to be output from the second selector 33 is hereinafter referred to as "selected clock 2"). In other words, the selected clock 1 and the selected clock 2 have phases different from each other by 90°.

The clock mask circuit 35 masks the hazard caused when the selected clock 1 is switched by the selected clock 2, to thereby prevent the hazard from being caused. Also, the clock mask circuit 35 generates the feedback clock signal CLKF based on the selected clock 1. Then, the feedback clock signal CLKF is fed back to the PLL circuit 10. The clock mask circuit 35 will be described in more detail later.

Here, the control circuit 31 will be described in more detail. The control circuit 31 includes ½ frequency divider circuits 41 and 42, a High/Low detection circuit 43, a second counter 44, a comparator 45, and a selected signal switching circuit 46. The ½ frequency divider circuit 41 generates a ½-frequency-divided clock signal which is obtained by dividing the frequency of the reference clock signal CLKR into two. The ½ frequency divider circuit 42 generates a ¼-frequency-divided clock signal which is obtained by further halving the frequency of the ½-frequency-divided clock signal output from the ½ frequency divider circuit 41. The High/Low detection circuit 43 generates a switch signal indicating a timing of switching the phase of the clock signal to be selected by the clock selection circuit, based on the ¼-frequency-divided clock signal and the feedback clock signal. The second counter 44 is, for example, a 8-bit counter, which counts the number of clocks of the ½-frequency-divided clock signal and outputs a 8-bit count value.

The comparator 45 compares the count value to be output from the second counter 44 and the fine adjustment period set value m contained in the frequency profile, and sets the comparison signal to be output to "1" during a time period corresponding to the fine adjustment period set value m. Note that the comparison signal is "0" when the value is not "1". The selected signal switching circuit 46 sets a position of the phase of the multiphase clock signal to be selected by the clock selection circuit based on the change width set value X contained in the frequency profile, and based on the comparison signal. The selected signal switching circuit 46 shifts, for example, the position of the selected phase designated by the selected signal by X phases from the previous cycle in response to the rise of the switch signal. When the value of the comparison signal is "1", the position of the selected phase to be selected in response to the selected signal is shifted by X+1 phases from the previous cycle. In the embodiment, the polarity value P is given to the selected signal switching circuit 46 as the frequency profile. The selected signal switching circuit 46 adds or subtracts a value of the position of the selected phase designated by the selected signal based on the polarity value P.

Figure 3:
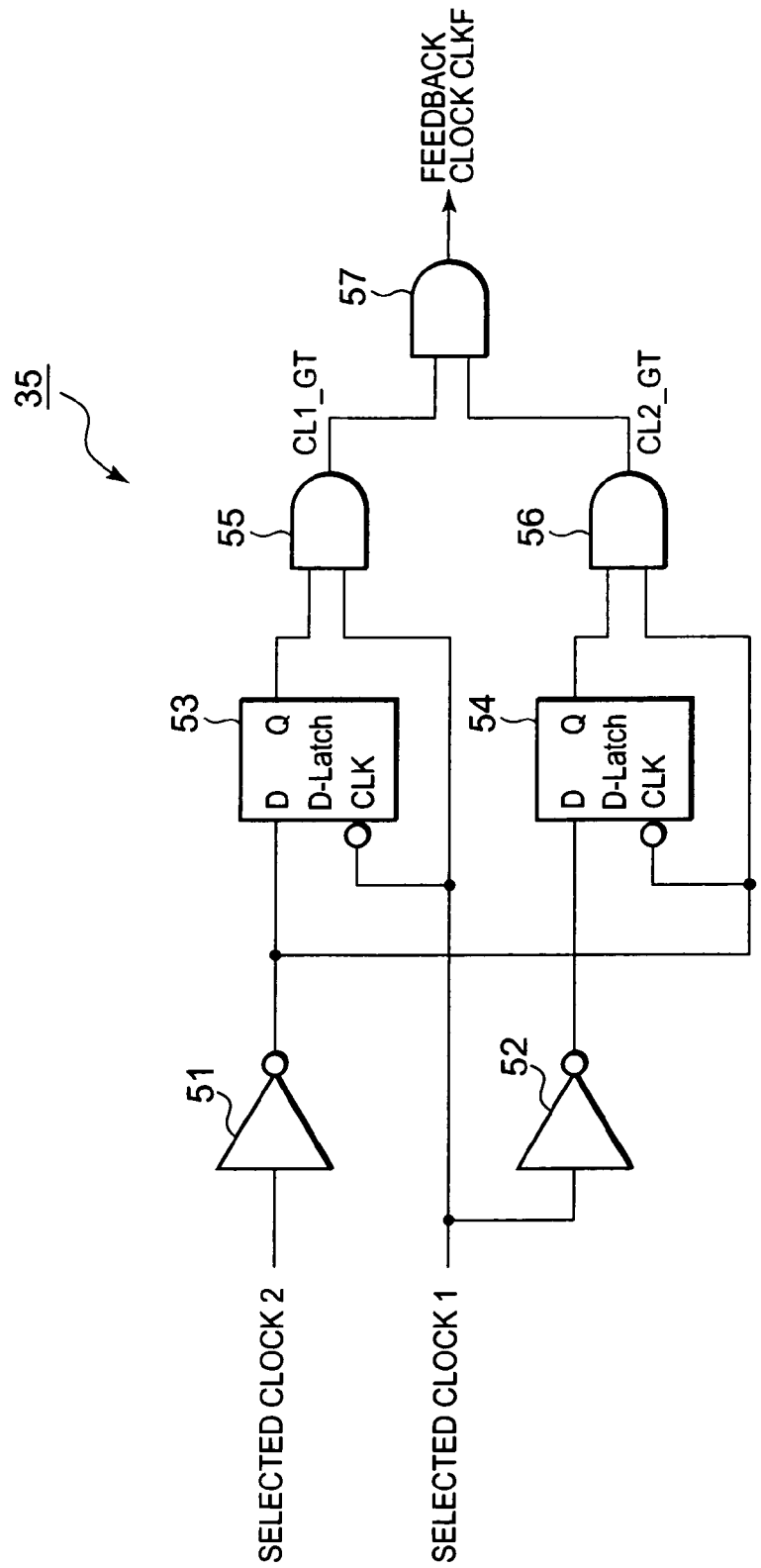
FIG. 3 is a circuit diagram of a clock mask circuit according to the embodiment of the present invention.

Here, the clock mask circuit 35 will be described in more detail. FIG. 3 shows a circuit diagram of the clock mask circuit 35. As shown in FIG. 3, the clock mask circuit 35 includes inverters 51 and 52, D latches 53 and 54, and AND gates 55 to 57.

The inverters 51 and 52 each invert the output corresponding to the input. The D latches 53 and 54 each hold and output a signal level of an input terminal D in response to the rise of the signal to be input to a clock input terminal CLK. Further, the D latches 53 and 54 each set the output to a low level in response to the rise of the signal to be input to the clock input terminal CLK. In this case, the D latches 53 and 54 each hold a value held at a rising edge of the signal to be input to the clock input terminal CLK during a time period in which the signal to be input to the clock input terminal CLK is in the high level. When the signal to be input to the clock input terminal CLK is in the low level, the D latches 53 and 54 each constantly output a low level signal. The AND gates 55 to 57 each output a high level signal in a case where the signals to be input to two input terminals are both in the high level, and output the low level signal in the other cases.

The selected clock 2 is input to the input terminal D of the D latch 53 through the inverter 51, and the selected clock 1 is input to the clock input terminal CLK of the D latch 53. The selected clock 1 is input to the input terminal D of the D latch 54 through the inverter 52, and the selected clock 2 is input to the clock input terminal CLK of the D latch 54 through the inverter 51. A signal to be output from an output terminal Q of the D latch 53 is input to one terminal of the AND gate 55, and the selected clock 1 is input to the other terminal of the AND gate 55. Then, the AND gate 55 generates a clock signal CL1_GT which is obtained by masking a portion of the selected clock 1, in which the hazard is caused, in response to the input signal. A signal to be output from the output terminal Q of the D latch 54 is input to one terminal of the AND gate 56, and the selected clock 2 is input to the other terminal of the AND gate 56 through the inverter 51. Then, the AND gate 56 generates a clock signal CL2_GT which is obtained by masking a portion of the selected clock 2, in which the hazard is caused, in response to the input signal. The clock signal CL1_GT is input to one input terminal of the AND gate 57, and the clock signal CL2_GT is input to the other input terminal of the AND gate 57. Then, the AND gate 57 generates the feedback clock signal CLKF in response to the input signal.

Figure 4:
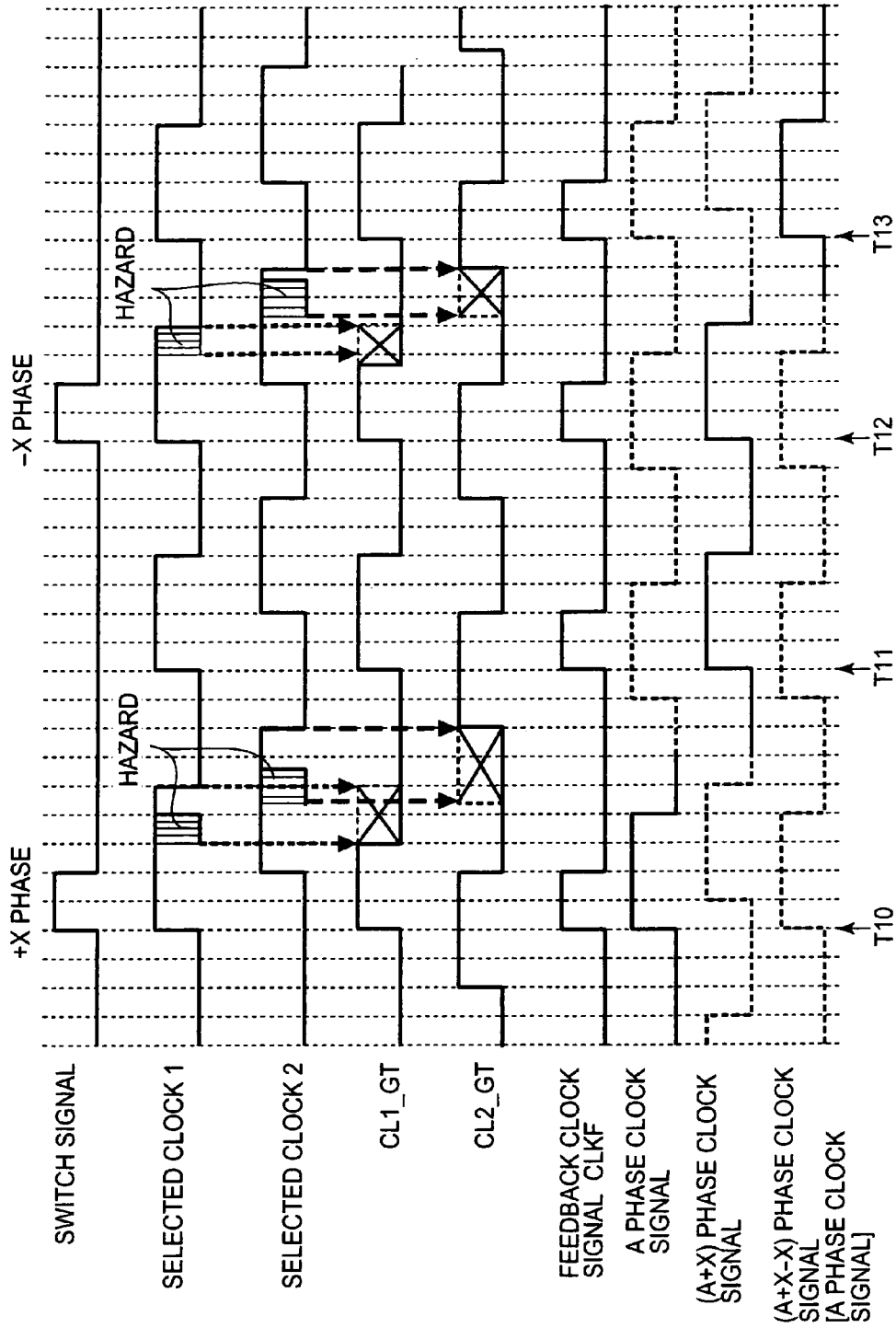
FIG. 4 is a timing chart showing operations of the clock mask circuit according to the embodiment of the present invention.

Description is given of operations of the clock mask circuit 35. FIG. 4 is a timing chart showing the operations of the clock mask circuit 35. An example of FIG. 4 shows a case where the clock selection circuit 30 first selects a clock signal with an A-th phase (A-phase clock signal), next, the phase of the clock signal to be selected by the clock selection circuit 30 is shifted to a positive direction by X phases from the A-phase, and then, the phase of the clock signal to be selected by the clock selection circuit 30 is shifted in a negative direction by X phases.

As shown in FIG. 4, before the switch signal rises at a timing T10, the clock mask circuit 35 selects the A-phase clock signal. Then, the clock mask circuit 35 outputs the feedback clock signal CLKF synchronized with the A-phase clock signal. Subsequently, when the switch signal rises at the timing T10, the first selector 32 and the second selector 33 each switch the phase of the clock signal to be output. In this case, the hazard is caused in the clock signals to be output. The clock mask circuit 35 generates the clock signal CL1_GT which is obtained by masking a portion between a time point when the hazard is caused in the selected clock 1 and a time point when the selected clock 1 subsequently falls, through the operations of the D latch 53 and the AND gate 55. Meanwhile, the clock mask circuit 35 generates the clock signal CL2_GT which is obtained by masking a portion between a time point when the hazard is caused in the selected clock 2 and a time point when the selected clock 2 subsequently falls, through the operations of the D latch 54 and the AND gate 56. Then, the clock mask circuit 35 outputs the feedback clock signal CLKF from the AND gate 57 based on results of logical conjunction between the clock signal CL1_GT and the clock signal CL2_GT. The feedback clock signal CLKF is synchronized with the selected clock 1 and becomes a signal with the cycle, in which the signal is in the high level, which corresponds to a phase difference between the selected clock 1 and the selected clock 2.

Then, the feedback clock signal CLKF is synchronized with the rise of a (A+X)-phase clock signal at a timing T11, and becomes a signal which has the cycle, in which the signal is in the high level, which corresponds to the phase difference between the selected clock 1 and the selected clock 2, and which is generated based on the (A+X)-phase clock signal.

During a time period from the timing T11 to the time point when the phase of the feedback clock signal CLKF is subsequently switched, the feedback clock signal CLKF, which is generated based on the (A+X)-phase clock signal, is fed back to the PLL circuit 10. The phase of the (A+X)-phase clock signal is delayed as compared with the A-phase clock signal, and a phase difference corresponding to the phase delay is generated between the reference clock signal CLKR and the feedback clock signal CLKF. For this reason, in the PLL circuit 10, the frequency of the multiphase clock signal to be generated so as to correspond to the phase delay is set high.

Subsequently, when the switch signal is input at a timing T12, the first selector 32 and the second selector 33 each switch the phase of the clock signal to be output. The switched phase of the clock signal of this case becomes A+X−X=A. In other words, the feedback clock signal CLKF is synchronized with the A-phase clock signal. Note that the feedback clock-signal CLKF is synchronized with the A-phase clock at a timing T13 which is a timing after the selected clock is switched.

During a time period from the timing T13 to the time point when the phase of the feedback clock signal CLKF is switched, the feedback clock signal CLKF, which is generated based on the A-phase clock signal, is fed back to the PLL circuit 10. The phase of the A-phase clock signal advances as compared with the (A+X)-phase clock signal, and a phase difference corresponding to the phase advance is generated between the reference clock signal CLKR and the feedback clock signal CLKF. For this reason, in the PLL circuit 10, the frequency of the multiphase clock signal to be generated so as to correspond to the phase advance is set low.

Figure 5:
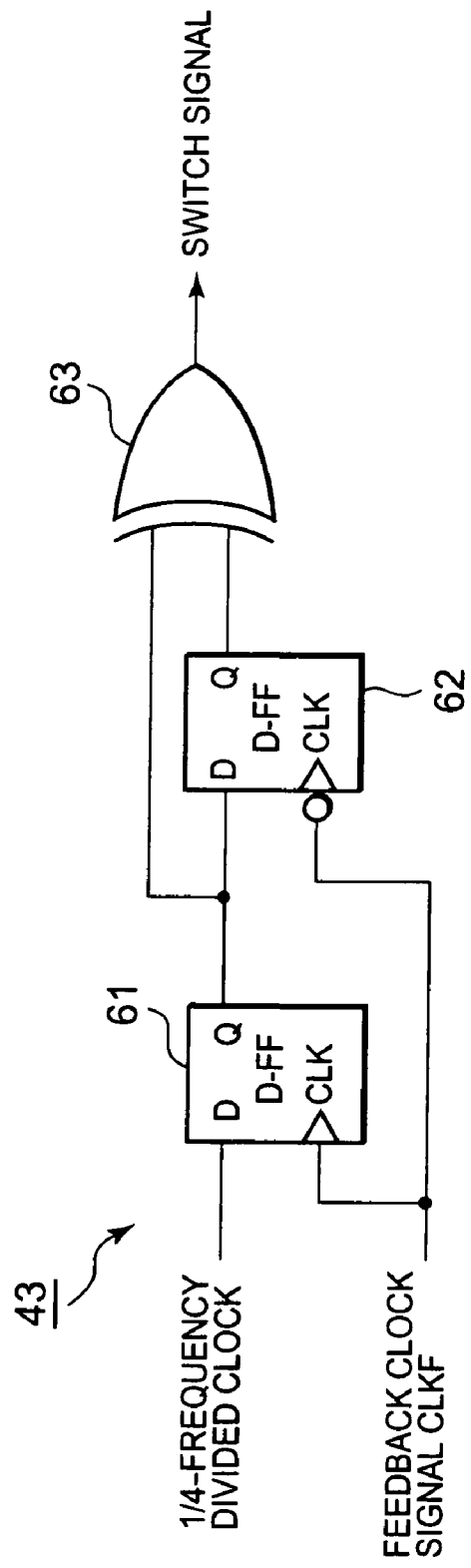
FIG. 5 is a circuit diagram of a High/Low detection circuit according to the embodiment of the present invention.

The switch signal mentioned above is a signal to be generated in the High/Low detection circuit 43. It is necessary to generate the switch signal at a timing when the switching of the phase of the clock signal selected by the clock selection circuit 30 is smoothly performed. For this reason, in the High/Low detection circuit 43, the switch signal is generated based on the ¼-frequency-divided clock signal obtained by dividing the frequency of the reference clock signal CLKR into four, and based on the feedback clock signal CLKF. FIG. 5 shows a circuit diagram of the High/Low detection circuit 43, and description is given of the High/Low detection circuit 43.

As shown in FIG. 5, the High/Low detection circuit 43 includes D flip-flops 61 and 62, and an EX-OR gate 63. The D flip-flop 61 has the input terminal D to be input with a ¼-frequency-divided clock signal, and has the clock input terminal CLK to be input with the feedback clock signal CLKF. The input terminal D of the D flip-flop 62 is connected to the output terminal Q of the D flip-flop 61, and the clock input terminal CLK is input with the feedback clock signal CLKF. In this case, the D flip-flop 61 holds the signal level of the input terminal D at the rise of the feedback clock signal CLKF, and the D flip-flop 62 holds the signal level of the input terminal D at the fall of the feedback clock signal CLKF. One input terminal of the EX-OR gate 63 is connected to the output terminal Q of the D flip-flop 61, and the other input terminal thereof is connected to the output terminal Q of the D flip-flop 62. The EX-OR gate 63 outputs a high level signal when the levels of the signals to be input to the two input terminals are different from each other, and outputs a low level signal when the levels of the signals are the same.

Figure 6:
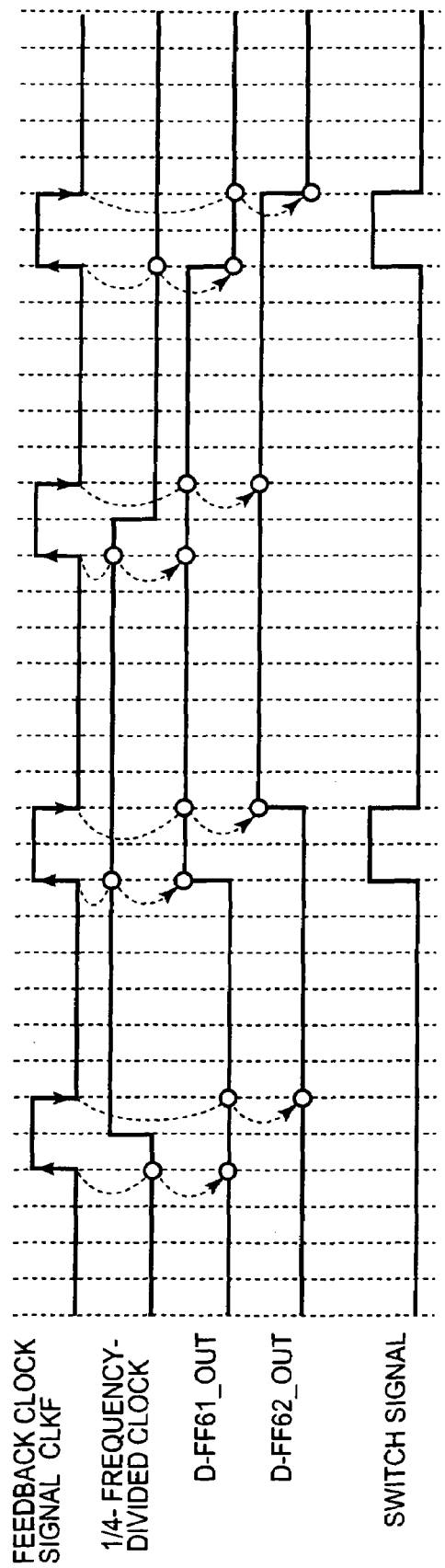
FIG. 6 is a timing chart showing operations of the High/Low detection circuit according to the embodiment of the present invention.

FIG. 6 is a timing chart showing the operations of the High/Low detection circuit 43. As shown in FIG. 6, the switch signal to be output from the High/Low detection circuit 43 is synchronized with the feedback signal and output at the high level each time in the time period when the ¼-frequency-divided clock signal becomes the high level and in the time period when the ¼-frequency-divided clock signal becomes the low level. The selected signal switching circuit 46 switches the phase of the clock signal to be selected in response to the switch signal.

Figure 7:
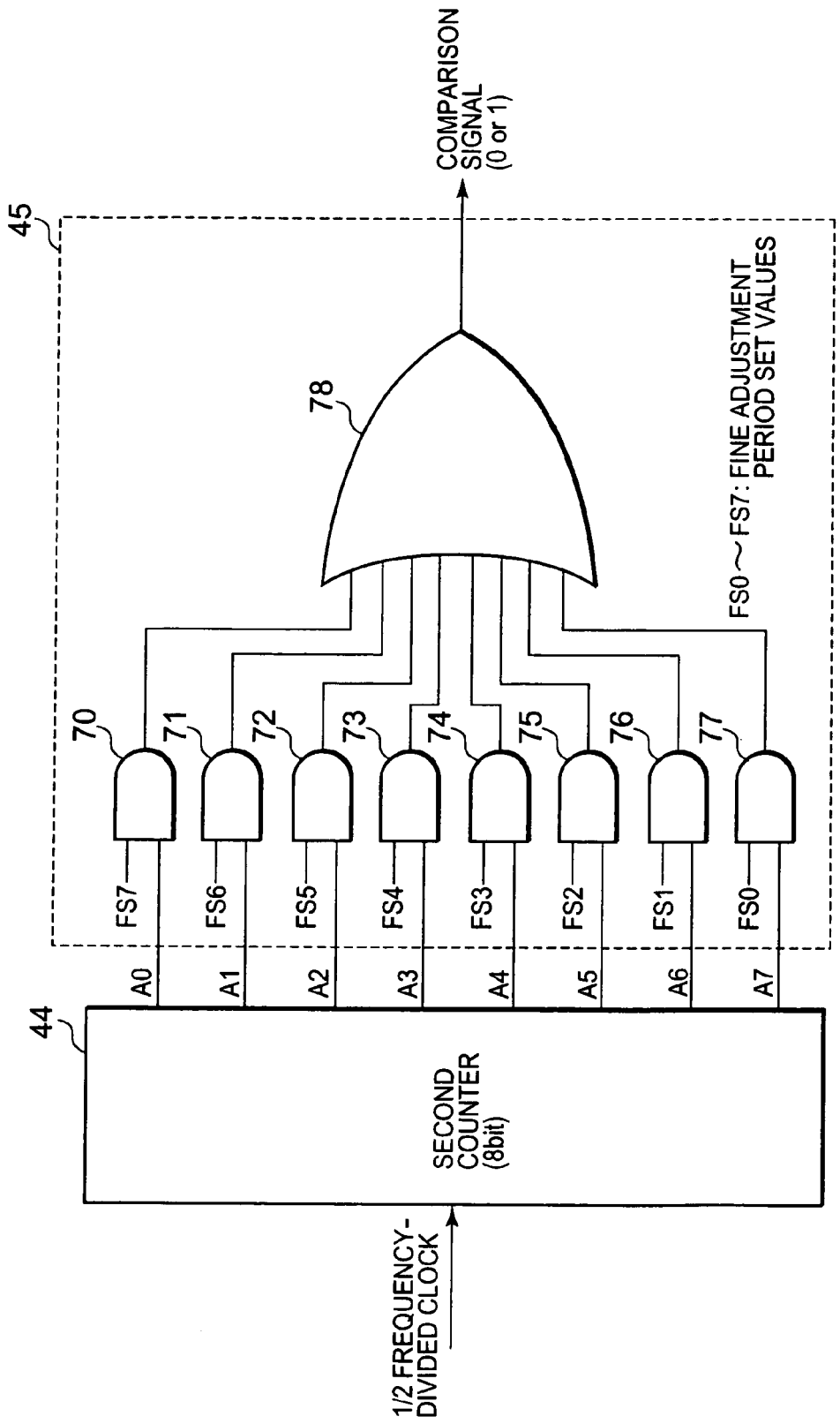
FIG. 7 is a circuit diagram of a comparator according to the embodiment of the present invention.

Here, the comparator 45 will be described in detail. The comparator 45 sets the comparison signal to be output, to the high level (for example, "1") during the time period designated by the fine adjustment period set value m. FIG. 7 shows an example of a circuit of the comparator 45. As shown in FIG. 7, the comparator 45 includes AND gates (for example, AND gates 70 to 77) each of which handles the number of bits which is the same as that of the fine adjustment period set value m, and an OR gate 78 for generating a comparison signal based on the results of the logical conjunction between the outputs of all the AND gates. One input terminal of each of the AND gates 70 to 77 is input with bit values FS7 to FS0 of the fine adjustment period set value m, respectively. The other input terminals of each of the AND gates 70 to 77 is input with output values A0 to A7 of the second counter 44, respectively. When the maximum count value of the second counter 44 has 8 bits (256 counts), the comparator 45 sets the comparison signal to "1" during the period corresponding to the fine adjustment period set value m in the 256 counts of the ½-frequency-divided clock signal.

Figure 8:
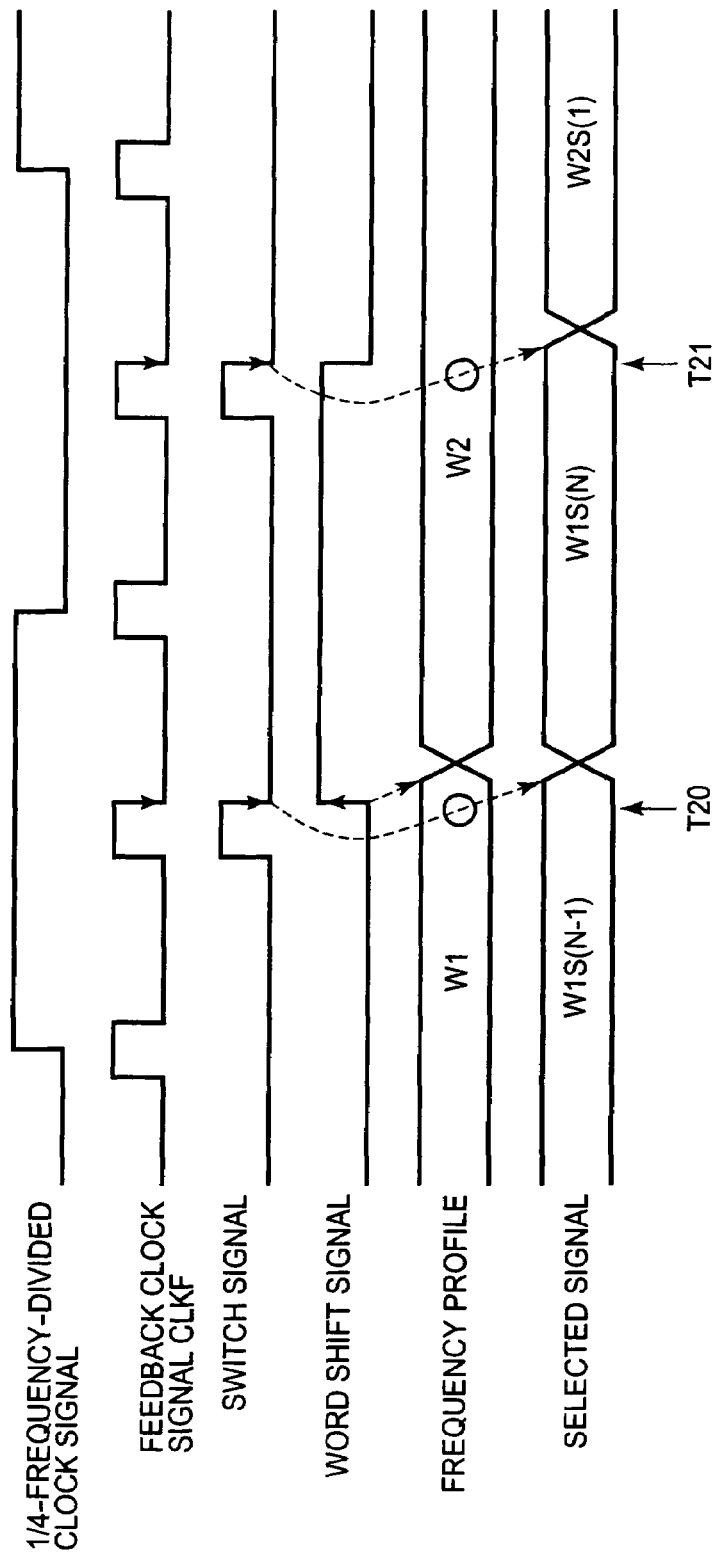
FIG. 8 is a timing chart showing a relationship between a timing of updating a frequency profile and a timing of updating a selected signal according to the embodiment of the present invention.

Then, description is given of the timing of updating the frequency profile and the timing of updating the selected signal. FIG. 8 is a timing chart showing updating operations executed at the timing of updating the frequency profile and at the timing of updating selected signal. In FIG. 8, a pulse of the word shift signal is output when the count value of the first counter 21 reaches the maximum value. The pulse of the word shift signal is output according to the falling edge of the switch signal by the D flip-flop 22, and is delayed as compared with the switch signal. Further, in the embodiment, the selected signal switch circuit 46 outputs the selected signal based on the values of the frequency profile according to the falling edge of the switch signal.

In an example shown in FIG. 8, the word shift signal becomes high level at the falling edge of the switch signal at a timing T20. At this time, the frequency profile is updated with a little delay from the rising edge of the word shift signal. As a result, the value of the selected signal is updated based on the frequency profile obtained before being updated at the falling edge of the switch signal at the timing T20.

After that, the switch signal falls at a timing T21. At this time, the count value of the first counter 21 is reset, and the word shift signal falls. Then, the frequency profile is updated after the rise of the word shift signal at the timing T20. Accordingly, at the timing T21, the selected signal switching circuit 46 sets the value of the selected signal based on the updated frequency profile.

In other words, the frequency profile holding circuit 20 updates the frequency profile for each predetermined cycle based on the reference clock signal CLKR or the ½-frequency-divided clock signal. Then, the control circuit 31 sets the change width X of the clock signal to be selected based on the change width set value X. In addition, the control circuit 31 sets a ratio between a time period in which the change width of the phase of the selected clock signal corresponds to X-phase, and a time period in which the phase thereof corresponds to (X+1)-phase, based on the fine adjustment period set value m contained in the frequency profile, in the predetermined cycle.

Here, description is given of an adjustment width of the frequency of the multiphase clock generating circuit 1 according to the embodiment. First, in a case where the phase of the feedback clock signal CLKF matches the phase of the reference clock signal CLKR through the operations of the PLL circuit, in the cycle of each of the clock signals, the following formula (1) is established.

$$Tclki = Tclkf = Tclko \quad (1)$$

where Tclki represents a cycle of the reference clock signal CLKR, Tclkf represents a cycle of the feedback clock signal CLKF, and Tclko represents a cycle of the multiphase clock signal.

Further, in a case where the phase of the clock signal, which is used as a reference of the feedback clock signal CLKF, is switched, in the cycle of each of the clock signals, the following formula (2) is established.

$$Tclki = Tclkf = (1+\alpha)Tclko \quad (2)$$

where α represents a phase difference between the clock signal after being shifted and the clock signal before being shifted.

The switching of the feedback clock signal CLKF is performed in synchronization with the reference clock signal CLKR. Accordingly, α becomes a value which can be controlled by the control circuit. For example, in a case where the multiphase clock signal has 256 phases in one cycle, the phase to be selected is changed by X phases based on the change width set value X for each n cycle of the reference clock signal CLKR, and the fine adjustment period set value m is "0", α is represented as X/(256×n). By substituting the value α, the frequency of the multiphase clock signal can be represented as the following formula (3).

$$Fclko = (1+(X/(256n)))Fclki \quad (3)$$

On the other hand, in the embodiment, when the multiplication factor is 100±several %, a 3/2 cycle or more of the feedback clock signal CLKF is included in the cycle in which the ¼-frequency-divided clock signal becomes the high level or in the cycle in which the ¼-frequency-divided clock signal becomes the low level. For this reason, one cycle of the switch signal is output for each two cycles of the reference clock signal CLKR, and the selected clock is switched. In addition, the ratio between the time period in which the change width of the clock signal to be selected corresponds to X-phase and the time period in which the change width thereof corresponds to (X+1)-phase, is set to 8 bits (maximum count value of the first and second counters). The ratio is, for example, (256−m):m. Further, in the embodiment, the ½-frequency-divided clock signal is counted by the first and second counters. Accordingly, n becomes 2. In view of the above, an average value a according to the embodiment is represented as (256X+m)/(256×256×2). By substituting the value α, the frequency of the multiphase clock signal is represented as the following formula (4).

$$Fclko=(1+((256X+m)/(256\times 256\times 2)))Fclki \quad (4)$$

Further, in the embodiment, the polarity value P is given as the frequency profile. The polarity value P represents a polarity of the change width of the phase to be selected.

Accordingly, when the polarity value P is taken into consideration, the formula (4) is represented as the following formula (5).

$$Fclko=(1\pm((256X+m)/(256\times 256\times 2)))Fclki \quad (5)$$

Figure 9:
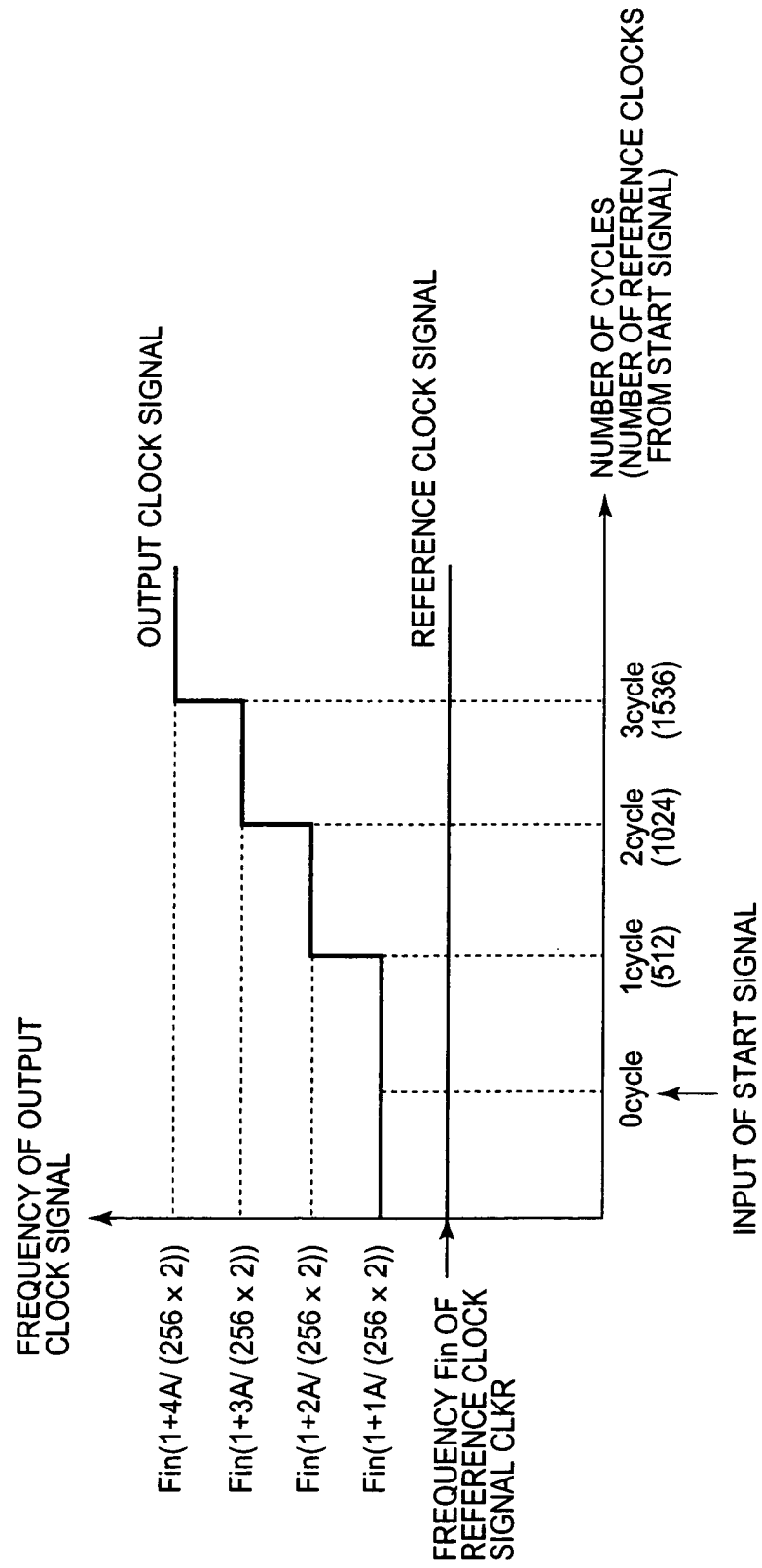
FIG. 9 is a diagram showing an example of the frequency profile (horizontal axis represents the number of cycles)
Figure 10:
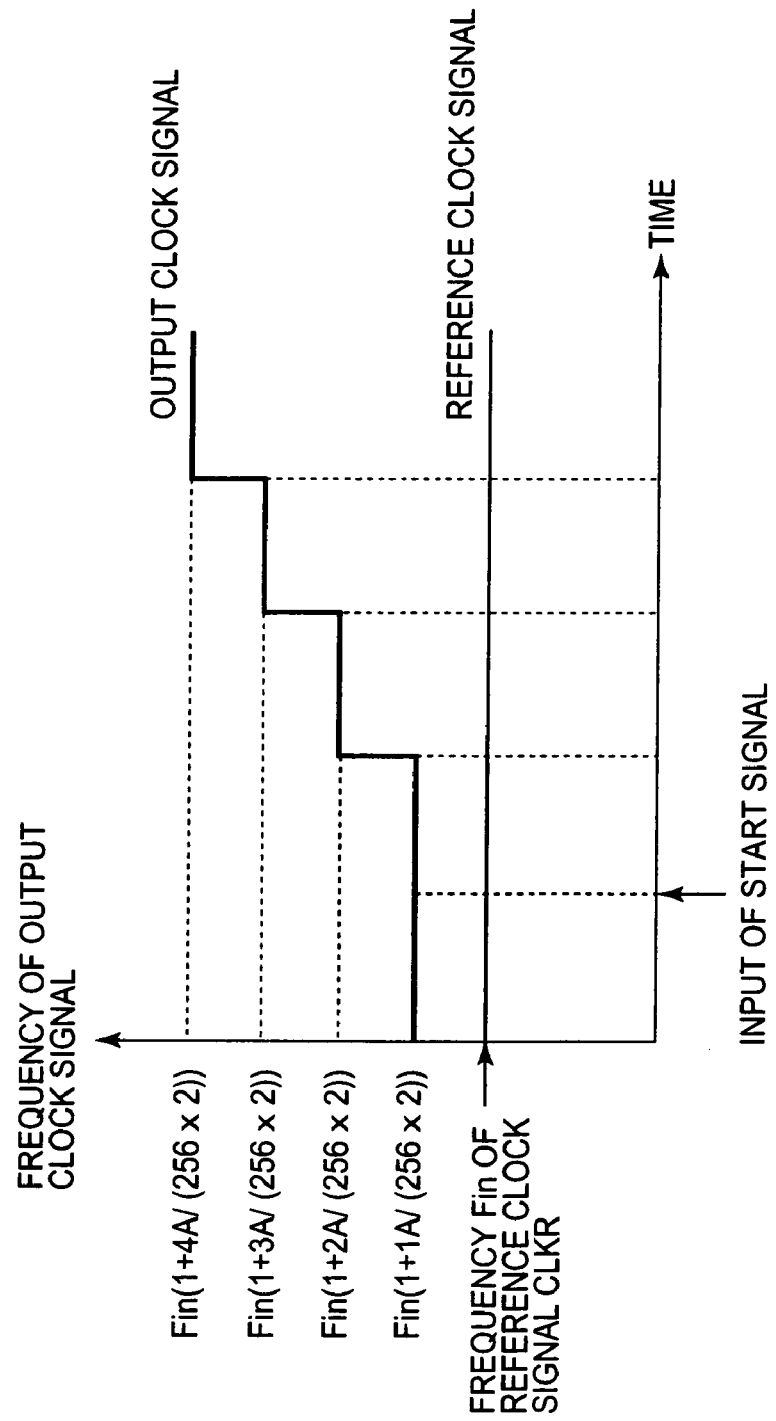
FIG. 10 is a diagram showing an example of the frequency profile (horizontal axis represents time)

From the formula (5), it is apparent that the multiplication factor of the frequency of the multiphase clock generating circuit according to the embodiment can be changed for each 512 cycles of the reference clock signal CLKR. Here, as an example of the frequency profile, description is given of a case where the polarity value P of "positive", the change width set value X of "A", and the fine adjustment period set value m of "0" are held as the frequency profile in an initial word stored in the memory 23, and the change width set value X is increased by A in the frequency profile to be held in the subsequent words. FIG. 9 shows the change characteristic of the frequency of this case. As shown in FIG. 9, when the start signal is input to the frequency profile holding circuit 20, the multiplication factor of the frequency of the multiphase clock signal increases by A/(256×2) for each cycle (the number of clocks of the reference clock signal is 512) In this case, the frequency of the reference clock signal CLKR is constant, so the horizontal axis of FIG. 9 can be regarded as a time. FIG. 10 shows the frequency profile in the case where the horizontal axis represents the time. As shown in FIGS. 9 and 10, as regards the change characteristic of the frequency of the multiphase clock signal according to the embodiment, the number of clocks of the reference clock signal and an amount of change with the elapse of time can be arbitrarily set based on the values of the frequency profile to be held in the memory 23.

From the above description, the multiphase clock generating circuit 1 according to the embodiment, the values of the frequency profile output from the frequency profile holding circuit 20 can be updated with an predetermined cycle based on the reference clock signal CLKR. As a result, the multiplication factor of the multiphase clock signal to be output can be changed according to the number of clocks of the reference clock signal (or time). Specifically, the multiphase clock generating circuit 1 according to the embodiment appropriately sets the frequency profile to be held in the memory 23, and updates the frequency profile in response to the reference clock signal, thereby making it possible to periodically change the multiplication factor of the multiphase clock signal.

Further, the frequency profile contains the fine adjustment period set value m. Accordingly, the clock selection circuit 30 finely adjusts the change width of the phase of the clock signal to be selected even during one cycle (for example, period from the rise of the word shift signal to the subsequent rise thereof) based on the fine adjustment period set value m. As a result, the change width of the multiplication factor of the multiphase clock signal can be more finely set. Accordingly, the multiphase clock generating circuit 1 according to the embodiment can set the multiplication factor with high precision.

Figure 11:
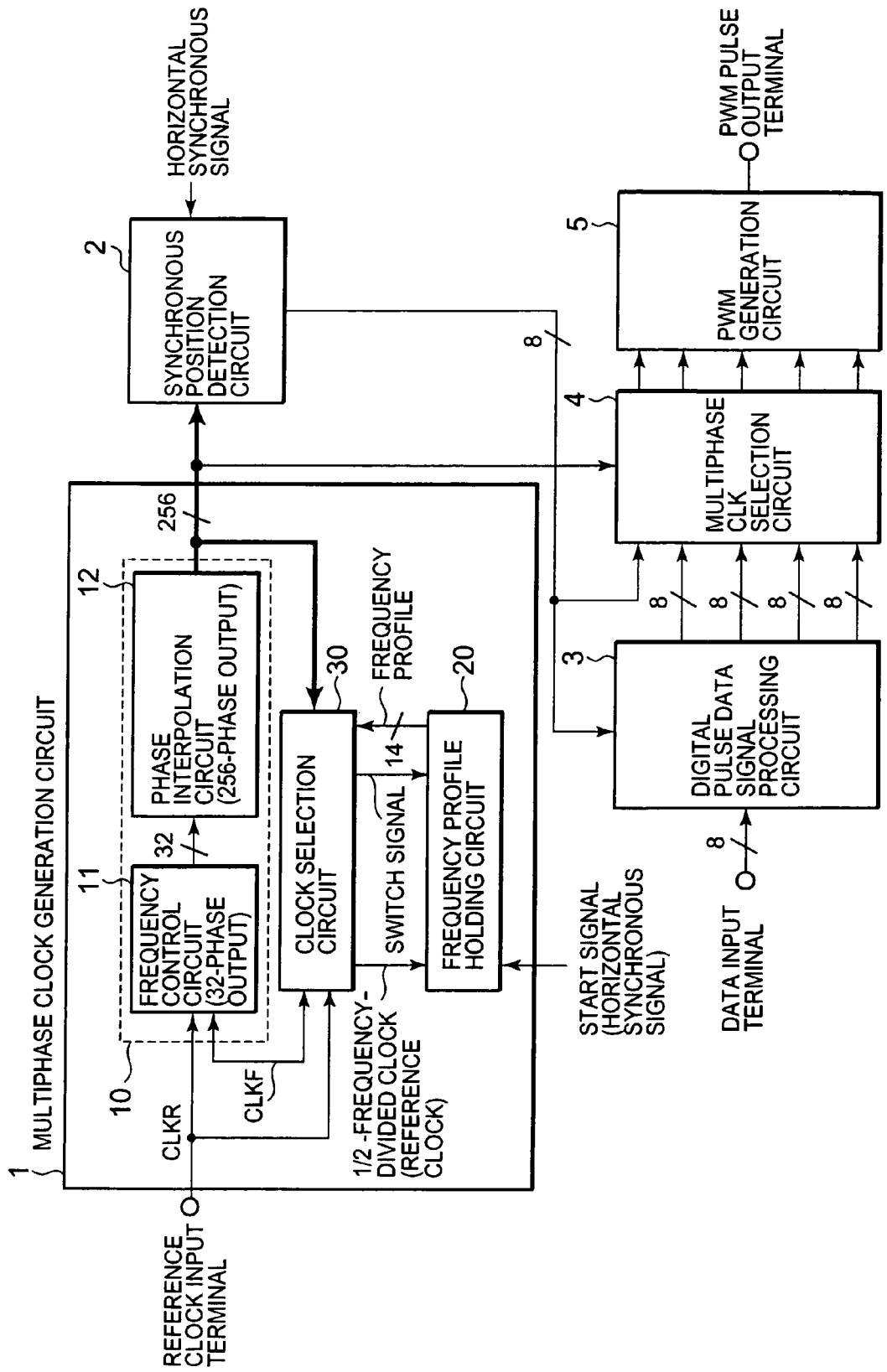
FIG. 11 is a block diagram of a pulse width modulation circuit which includes the multiphase clock generation circuit according to the embodiment of the present invention.

Next, description is given of an application of the multiphase clock generating circuit 1 according to the present invention to a pulse width modulation circuit according to the prior art. FIG. 11 is a block diagram of the pulse width modulation circuit including the multiphase clock generating circuit 1 according to the embodiment. Note that description as to components of the pulse width modulation circuit which are identical with those of the prior art is omitted.

Figure 12:
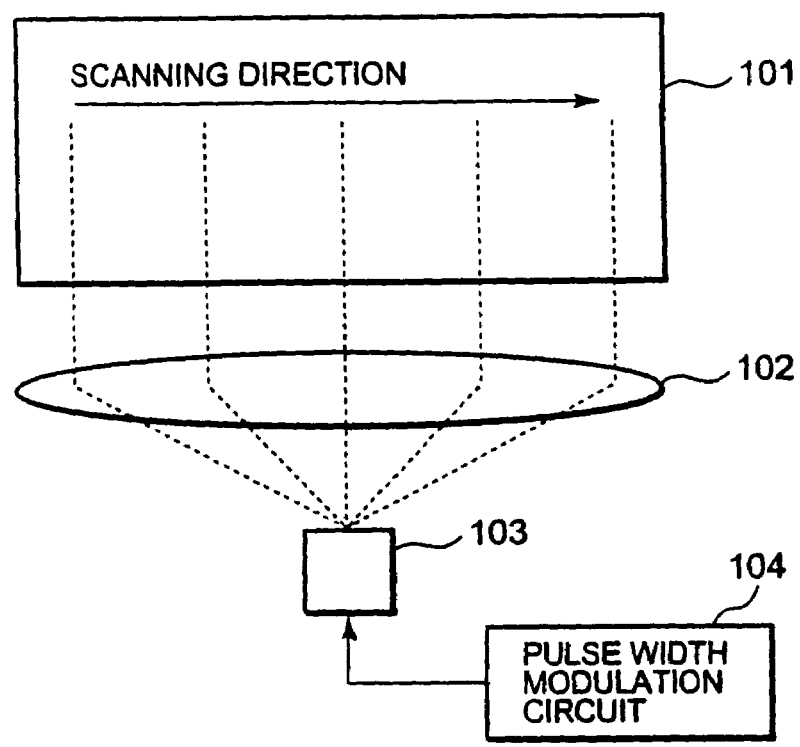
FIG. 12 is a block diagram of a laser beam printer according to a prior art.
Figure 13:
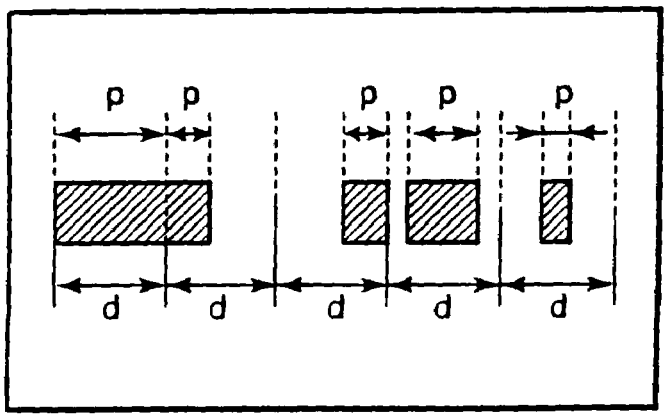
FIG. 13 is a diagram showing an example of printing results of the laser beam printer according to the prior art.
Figure 14:
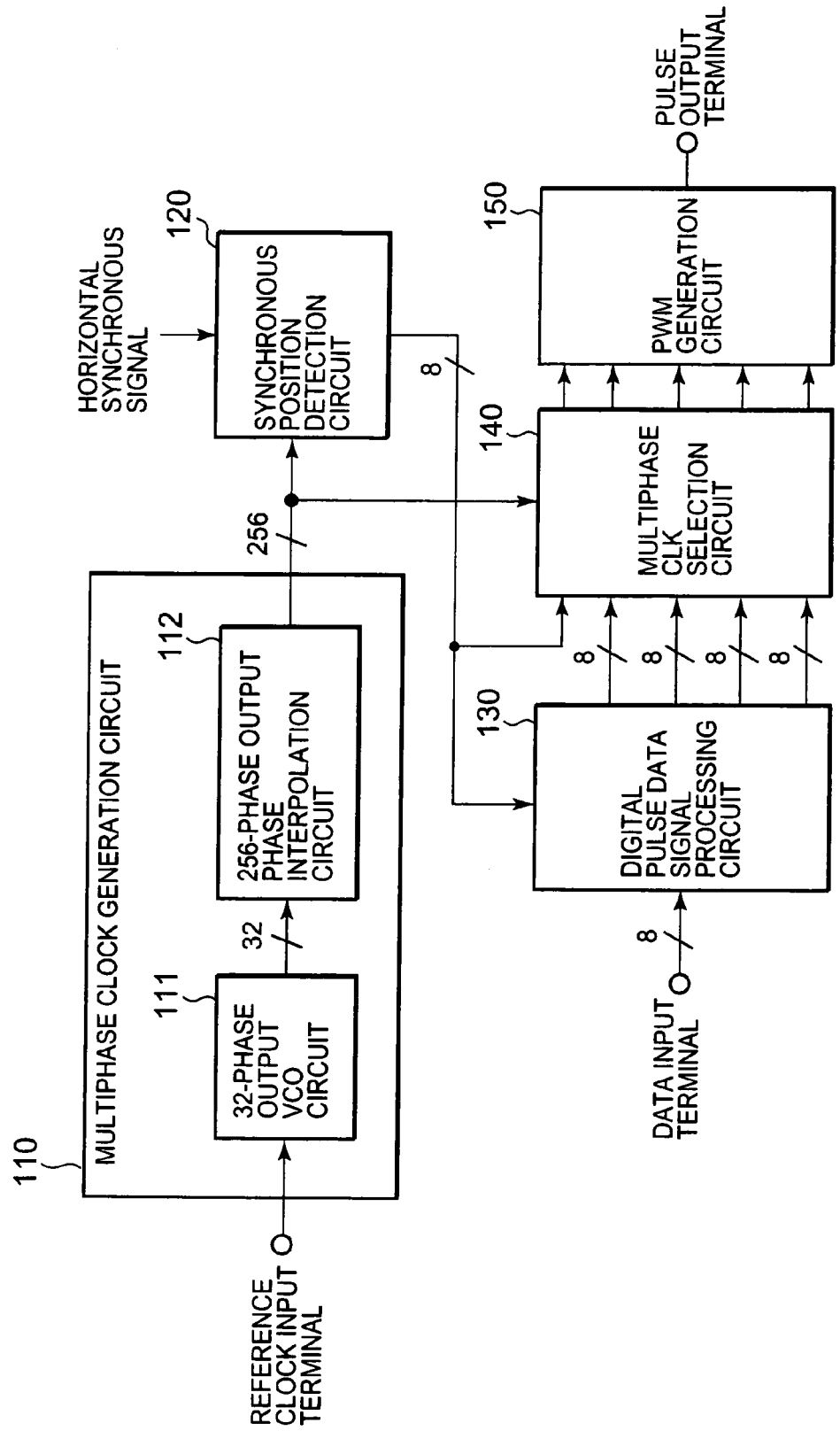
FIG. 14 is a block diagram of a pulse width modulation circuit according to the prior art.

In the pulse width modulation circuit shown in FIG. 11, a frequency profile in which the characteristics of the lens 102 as shown in FIG. 12 are taken into consideration is set. The frequency profile is set by, for example, the following process. First, printing is performed with the fine adjustment period set value m being set to "0" and with the change width set value X being set to be constant. Based on the printing results, the variation in characteristic of the lens 102 is determined. Then, the fine adjustment amount for each printing position is calculated by taking the variation in characteristic of in the lens 102 into consideration, and the fine adjustment period set value m and the change width set value X, which are to be stored in each word of the memory 23, are determined based on the calculation results.

In the pulse width modulation circuit shown in FIG. 11, the horizontal synchronous signal, which is to be input in the synchronous position detection circuit, is input as the start signal to the frequency profile holding circuit 20. As a result, the frequency profile holding circuit 20 can be synchronized with the synchronous position detection circuit and the like and can operate. Then, the frequency profile holding circuit 20 is synchronized with the horizontal synchronous signal and outputs the frequency profile set in the above-mentioned manner. Then, for example, the frequency profile holding circuit 20 sets the frequency profile obtained at the time of starting the scanning, in a first word held in the memory, and sets the frequency profile according to the scanning time (or scanning position) in the subsequent words. As a result, the setting of the pulse width of the PWM pulse during one scanning period can be changed with the scanning time being set as a reference.

By storing the above-mentioned frequency profiles in the memory 23, the variation in characteristic of the lens 102 can be reduced by the pulse width of the PWM pulse generated by the pulse width modulation circuit. As a result, with the pulse width modulation circuit including the multiphase clock generating circuit 1 according to the embodiment, variations due to the printing position can be reduced through the control of the pulse width. Accordingly, even when a lens with low precision is used, high-quality printing can be achieved.

The present invention has been described in line with the embodiments, and it is apparent that the present invention is not limited to the above embodiments, but may be modified and changed without departing from the scope and spirit of the invention. For example, in the above embodiments, the first counter and the second counter each have the 8-bit maximum count value, but the maximum count value is changed to a 6-bit value or a 7-bit value, thereby making it possible to set the timing of outputting the word shift signal shorter and to make the timing of updating the frequency profile shorter.

What is claimed is:

1. A multiphase clock generation circuit, comprising:
 a phase-locked loop circuit for generating multiphase clock signals based on a reference clock signal;
 a frequency profile holding circuit for holding a frequency profile of each of the multiphase clock signals, starting output of the frequency profile in response to a start signal, and for updating the frequency profile with a predetermined cycle based on the reference clock signal; and a clock selection circuit for selecting a clock signal with an arbitrary phase from among the multiphase clock signals based on the frequency profile, and for feeding back the selected clock signal to the phase-locked loop circuit, wherein the frequency profile holding circuit comprises:
a first counter for counting a number of clocks of the reference clock signal; and
a memory for holding the frequency profile; and the frequency profile holding circuit updates the frequency profile to be output from the memory according to the number of clocks.

2. The multiphase clock generation circuit according to claim 1, wherein the first counter starts counting of the number of clocks of the reference clock signal in response to the start signal.

3. The multiphase clock generation circuit according to claim 1, wherein:
the frequency profile contains a fine adjustment period set value for dividing the predetermined cycle at an arbitrary ratio; and
the clock selection circuit finely adjusts a phase change width of the clock signal to be selected based on the fine adjustment period set value.

4. The multiphase clock generation circuit according to claim 3, wherein the clock selection circuit changes the phase change width of the clock signal to be selected based on a change width set value contained in the frequency profile, and finely adjusts a phase change width designated by the change width set value, based on the fine adjustment period set value.

5. The multiphase clock generation circuit according to claim 1, wherein:
the frequency profile holding circuit comprises a first counter for counting the number of clocks of the reference clock signal;
the clock selection circuit comprises:
a second counter having a maximum count value which is the same as that of the first counter, for counting the number of clocks of the reference clock signal; and
a comparator for comparing a count value output from the second counter and a fine adjustment period set value for dividing the predetermined cycle at an arbitrary ratio, the fine adjustment set value being output from the frequency profile holding circuit;
the comparator outputs a comparison signal according to the fine adjustment period set value; and
the clock selection circuit finely adjusts a change width set value contained in the frequency profile in response to the comparison signal, and selects a clock signal with a phase to be fed back from among the multiphase clock signals based on the finely adjusted change width set value.

6. The multiphase clock generation circuit according to claim 1, wherein the multiphase clock generation circuit comprises a clock generation circuit for generating a clock signal for adjusting a pulse width of a pulse width modulation circuit for outputting a pulse signal for modulating a laser output.

7. A multiphase clock generator, comprising:
a phase-locked loop circuit generating multiphase clock signals in response to a reference clock signal and a feed-back clock signal;
a frequency profile holding circuit for holding frequency profile information; and
a clock selection circuit selecting one of the multiphase clock signals in response to frequency profile information and providing selected clock signal to the phase-locked loop circuit as the feed-back clock signal, the frequency profile holding circuit further updating the frequency profile information to produce updated frequency profile information,
wherein the frequency profile holding circuit comprises:
a first counter for counting a number of clocks of the reference clock signal; and
a memory for holding the frequency profile; and
the frequency profile holding circuit updates the frequency profile to be output from the memory according to the number of clocks.

8. The generator according to claim 7, wherein the updated frequency profile information is further supplied to the clock selection circuit to select another one of the multiphase clock signals.

* * * * *